United States Patent
Kim

(10) Patent No.: US 9,190,121 B2
(45) Date of Patent: Nov. 17, 2015

(54) SEMICONDUCTOR MEMORY DEVICE, SYSTEM HAVING THE SAME AND METHOD FOR GENERATING REFERENCE VOLTAGE FOR OPERATING THE SAME

(71) Applicant: SK hynix Inc., Icheon-si Gyeonggi-do (KR)

(72) Inventor: Dong Kyun Kim, Cheongju-si (KR)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 14/010,680

(22) Filed: Aug. 27, 2013

(65) Prior Publication Data

US 2014/0153344 A1    Jun. 5, 2014

(30) Foreign Application Priority Data

Dec. 4, 2012   (KR) .................. 10-2012-0139704

(51) Int. Cl.
*G11C 5/14* (2006.01)
*G11C 11/4074* (2006.01)

(52) U.S. Cl.
CPC ............ *G11C 5/147* (2013.01); *G11C 11/4074* (2013.01); *G11C 2207/2254* (2013.01)

(58) Field of Classification Search
USPC ........................................ 365/189.05, 189.09
See application file for complete search history.

(56) References Cited

U.S. PATENT DOCUMENTS 4,477,736 A * 10/1984 Onishi ........................ 327/543
2004/0095810 A1 * 5/2004 Cioaca et al. ............ 365/189.09

* cited by examiner

*Primary Examiner* — Anthan Tran
(74) *Attorney, Agent, or Firm* — William Park & Associates Ltd.

(57) ABSTRACT

A semiconductor memory device and a method for generating a reference voltage needed for operating the same are disclosed. The semiconductor memory device includes a first decoder configured to generate a default set signal in response to a reset signal and a clock enable signal, a second decoder configured to generate a reference voltage set signal in response, and a reference voltage provider configured to generate an internal reference voltage.

18 Claims, 7 Drawing Sheets

SEMICONDUCTOR MEMORY DEVICE, SYSTEM HAVING THE SAME AND METHOD FOR GENERATING REFERENCE VOLTAGE FOR OPERATING THE SAME

CROSS-REFERENCE TO RELATED APPLICATION

This application claims priority based upon Korean patent application No. 10-2012-0139704 filed on Dec. 4, 2012, in the Korean Intellectual Property Office, the disclosure of which is incorporated herein by reference in its entirety.

BACKGROUND OF THE INVENTION

Embodiments of the present invention relate generally to a semiconductor memory device and a method for generating a reference voltage for operating the same, and more particularly to a semiconductor memory device including a reference voltage generator setting up an internal reference voltage, and a method for generating a reference voltage for operating the semiconductor memory device.

Semiconductor memory devices such as Dynamic Random Access Memories (DRAMs) are being widely used in electronic devices. With broadening uses of miniaturized high-speed electronic devices, the efforts to highly integrate the semiconductor devices and to improve its operation speed continue.

Joint Electron Device Engineering Council (JEDEC) serving as a semiconductor standardization organization has standardized a wide Input/Output (I/O) scheme considering a parallel-interface Low Power Double Data Rate (LPDDR) and a die stack package as the next-generation DRAM scheme. Many semiconductor companies are making efforts to develop DRAMs having more improved functions based on JEJEC standard.

With rapid development of mobile devices, the next-generation DRAMs optimized for such mobile devices have been rapidly developed to have smaller sizes and lower power consumption. Specifically, various attempts, such as voltage scaling, structural improvement, new I/O signaling, and signal-integration improvement, have been made to achieve low power consumption as well as to compensate for power consumption due to a high-speed operation.

SUMMARY

Various embodiments of the present invention are directed to providing a semiconductor memory device and a method for generating a reference voltage for operating the same that substantially obviate one or more problems due to limitations and disadvantages of the related art.

An embodiment of the present invention relates to a semiconductor memory device in which an internal reference voltage is generated using signals having already been used in the semiconductor memory device such that it can normally operate even though a reference voltage for a command/address (CA) or data I/O (DQ) is not provided through an external pin or pad, and a method for generating a reference voltage needed for the semiconductor memory device.

An embodiment of the present invention relates to a semiconductor memory device which is capable of establishing a reference voltage level needed for a command/address or data I/O (DQ) based on an enable time point of a clock enable signal (CKE) capable of being externally established, and a method for generating a reference voltage needed for operating the same.

An embodiment of the present invention relates to a semiconductor memory device configured to appropriate for mobile devices by reducing the number of pins connected to an external part.

In accordance with an embodiment of the present invention, a semiconductor memory device includes: a first decoder configured to generate a default set signal based on a reset signal and a clock enable signal; a second decoder configured to generate a reference voltage set signal based on the default set signal; and a reference voltage provider configured to generate an internal reference voltage based on the reference voltage set signal.

The first decoder may generate the default set signal according to a logic state of the clock enable signal at a transition time point of the reset signal.

The default set signal may be generated in such a manner that a magnitude of the internal reference voltage has a predetermined ratio with respect to a driving voltage driving the reference voltage provider.

If the clock enable signal has a first logic state at a transition time point of the reset signal, the first decoder may generate a first default set signal in a manner that a ratio of the internal reference voltage to the driving voltage has a first value. If the clock enable signal has a second logic state at a transition time point of the reset signal, the first decoder may generate a second default set signal in a manner that a ratio of the internal reference voltage to the driving voltage has a second value.

The reference voltage provider may be driven based on a core power-supply voltage (e.g., VDD2) or an input/output power-supply voltage (e.g., VDDQ).

The reference voltage provider may be driven by the core power-supply voltage, and the internal reference voltage is a command/address-buffer reference voltage (e.g., VREFCA).

The reference voltage provider may be driven by the input/output power-supply voltage, and the internal reference voltage may be a data-buffer reference voltage (e.g., VREFDQ).

The reference voltage provider may include a voltage divider.

The semiconductor memory device may further include: a register configured to generate a command/address set signal in response to a command/address input, and provide the command/address set signal to the second decoder.

After the internal reference voltage is set up during the power-up process, the internal reference voltage may be trained in response to the command/address set signal.

The semiconductor memory device may be a DRAM memory device based on LPDDR4 (Low Power Double Data Rate 4).

The internal reference voltage may not be received through a pin of a semiconductor memory chip mounted to the semiconductor memory device.

In accordance with an embodiment of the present invention, a method for generating a reference voltage includes: generating a default set signal based on a reset signal and a clock enable signal; generating a reference voltage set signal based on the default set signal; and generating a command/address-buffer reference voltage or a data-buffer reference voltage based on the reference voltage set signal and a driving voltage.

The internal reference voltage may include a command/address-buffer reference voltage and a data-buffer reference voltage.

The method may further include: after setting up at least one of the command/address-buffer reference voltage or the data-buffer reference voltage during a power-up process, training at least one of the command/address-buffer reference voltage or the data-buffer reference voltage in response to the driving voltage and a command/address input.

The generating the reference voltage set signal based on the default set signal may include: generating the reference voltage set signal in response to the command/address input, after setting up the reference voltage.

The generating the command/address-buffer reference voltage or the data-buffer reference voltage based on the reference voltage set signal and the driving voltage may include: generating the command/address-buffer reference voltage if the driving voltage corresponds to a core power-supply voltage; and generating the data-buffer reference voltage if the driving voltage corresponds to an I/O power-supply voltage.

The generating the default set signal based on the reset signal and the clock enable signal during the power-up process may include: generating the default set signal according to a logic state of the clock enable signal at a rising edge of the reset signal.

In an embodiment of the present invention, a memory system includes a semiconductor memory device; a memory controller configured to control the memory device; a memory interface configured to communicate between the semiconductor memory device and the memory controller; and a microprocessor configured to control the memory controller; wherein the semiconductor memory device comprises: a first decoder configured to generate a default set signal based on a reset signal and a clock enable signal; a second decoder configured to generate a reference voltage set signal based on the default set signal; and a reference voltage provider configured to generate an internal reference voltage based on the reference voltage set signal.

In an embodiment, an electronic device includes a memory system communicatively coupled to a central processing unit. The memory system includes a semiconductor memory device. The semiconductor memory device comprises: a memory controller configured to control the memory device; a memory interface configured to communicate between the semiconductor memory device and the memory controller; and a microprocessor configured to control the memory controller; wherein the semiconductor memory device comprises: a first decoder configured to generate a default set signal based on a reset signal and a clock enable signal; a second decoder configured to generate a reference voltage set signal based on the default set signal; and a reference voltage provider configured to generate an internal reference voltage based on the reference voltage set signal.

In an embodiment, a semiconductor memory device includes a first decoder configured to generate a default set signal based on a clock enable signal with a first logic state and a second logic state; a second decoder configured to decode the default signal and provide a reference voltage set signal to a reference voltage provider; and a reference voltage provider configured to generate and output a command/address-buffer reference voltage and a data-buffer reference voltage.

For example, the first logic state of the clock enable signal may correspond to a logic high state, and the second logic state may correspond to a logic low state. The reference voltage set signal may have an enabled bit to allow the reference voltage provider to generate a command/address-buffer voltage or a data-buffer reference voltage.

It is to be understood that both the foregoing general description and the following detailed description of the present invention are exemplary and explanatory and are intended to provide further explanation of the invention as claimed.

BRIEF DESCRIPTION OF THE DRAWINGS

The above and other features and advantages of the present invention will become readily apparent by reference to the following detailed description when considered in conjunction with the accompanying drawings.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

In association with the embodiments of the present invention, specific structural and functional descriptions are disclosed only for illustrative purposes, the embodiments of the present invention can be implemented in various ways without departing from the scope or spirit of the present invention.

Figure 1:
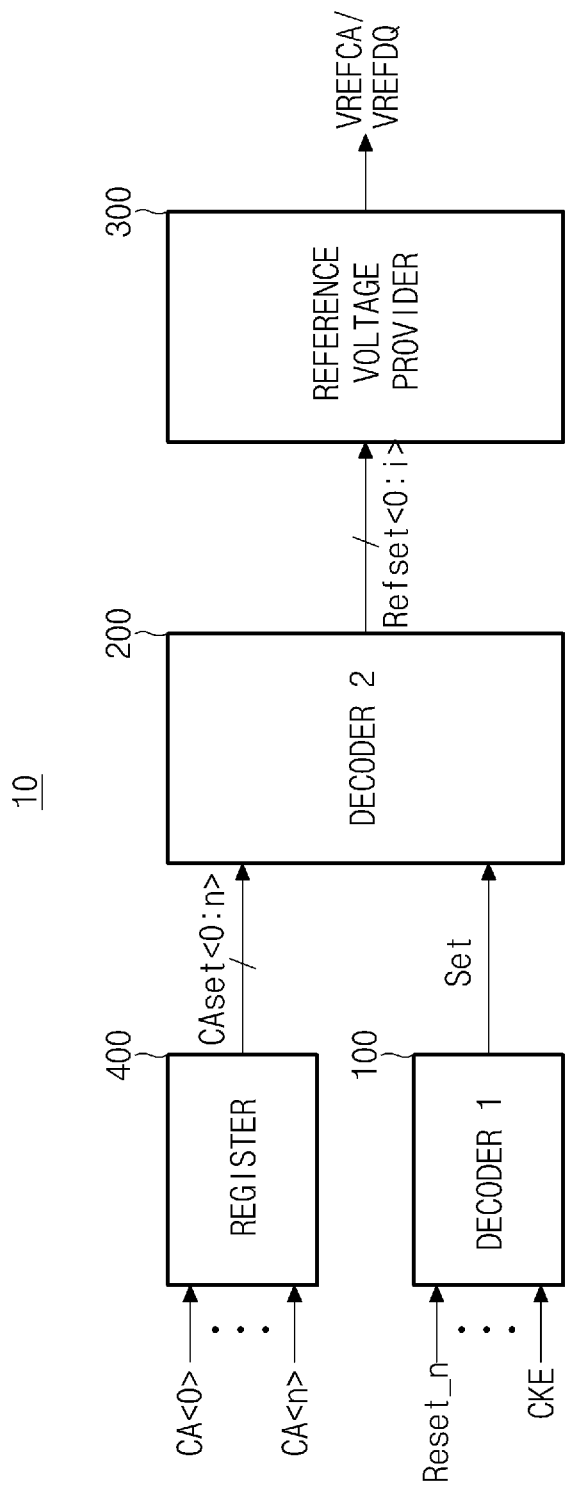
FIG. 1 is a block diagram illustrating a reference voltage generator contained in a semiconductor memory device according to an embodiment of the present invention.

FIG. 1 is a block diagram illustrating a reference voltage generator included in the semiconductor memory device according to an embodiment of the present invention.

A semiconductor memory device may perform internal operations using internal voltages generated from external voltages such as an external power-supply voltage (e.g., VDD) or a ground voltage (e.g., VSS). For example, in order to operate a data buffer and a command/address buffer, the semiconductor memory device may use an internal reference voltage such as a reference voltage VREFDQ for the data buffer and a reference voltage VREFCA for the command/address buffer.

The data buffer compares the data input (e.g., DQ) with the data buffer reference voltage VREFDQ, generates an internal data input (e.g., DIN) according to the comparison result, and provides the internal data input Din to a write driver.

The command/address buffer compares a command/address input with a command/address-buffer reference voltage VREFCA to generate an internal command/address input CA0, . . . , CAn. The command/address-buffer reference voltage VREFCA may be used as a reference voltage of input buffers of a command/address input (e.g., CA0, . . . , Can), a clock enable signal (e.g., CKE), a chip selection signal (e.g., CS), and a clock signal (e.g., CK).

If the internal reference voltage such as the data-buffer reference voltage VREFDQ and the command/address-buffer reference voltage VREFCA is received from an external device of the semiconductor memory device through pins, the number of pins required for the semiconductor memory device may be a limitation in miniaturizing the semiconductor memory device.

Referring to FIG. 1, the reference voltage generator 10 may include a first decoder 100, a second decoder 200, and a reference voltage provider 300.

The reference voltage generator 10 may generate a command/address-buffer reference voltage VREFCA and/or a data-buffer reference voltage VREFDQ in response to a reset signal Reset_n and a clock enable signal CKE.

During a power-up process of the semiconductor memory device, the reset signal Reset_n is enabled at a predetermined time point. A level of the command/address-buffer reference voltage VREFCA and/or a level of the data-buffer reference voltage VREFDQ may be determined according to a logic state of the clock enable signal CKE when the reset signal Reset_n is enabled.

The semiconductor memory device including the reference voltage generator 10 according to an embodiment of the present invention may be a semiconductor memory device based on the LPDDR4 standard of JEDEC.

A first decoder 100 may perform a predetermined logical operation, e.g. a decoding operation on the reset signal Reset_n and the clock enable signal CKE to generate a default set signal Set. The clock enable signal CKE may have one logic state of a first logic state and a second logic state when the reset signal Reset_n is enabled. For example, the first logic state may correspond to a logic high state, and the second logic state may correspond to a logic low state.

Therefore, the first decoder 100 may provide a default set signal Set having at least two states in response to the reset signal Reset_n and the clock enable signal CKE. In accordance with an embodiment of the present invention, the first decoder 100 may distinguish the clock enable signal CKE may have three or more states when the reset signal Reset_n is enabled. Thus, the default set signal Set may be variously set up based on the clock enable signal CKE and the reset signal Reset_n.

A second decoder 200 may generate a reference voltage set signal Refset in response to the default set signal Set. The reference voltage set signal Refset may be a signal including a plurality of bits, and at least one bit among the plurality of bits may be enabled so that the reference voltage provider 300 may generate the command/address-buffer reference voltage VREFCA and/or the data-buffer reference voltage VREFDQ.

The reference voltage provider 300 may generate the command/address-buffer reference voltage VREFCA and/or the data-buffer reference voltage VREFDQ in response to the reference voltage set signal Refset. In an embodiment of the present invention, it is determined whether the command/address-buffer reference voltage VREFCA or the data-buffer reference voltage VREFDQ will be generated in response to a driving voltage applied to the reference voltage provider 300.

In accordance with an embodiment of the present invention, the reference voltage provider 300 may include a first reference voltage provider for generating the command/address-buffer reference voltage VREFCA and a second reference voltage provider for generating the data-buffer reference voltage VREFDQ. Alternatively, the command/address-buffer reference voltage VREFCA and the data-buffer reference voltage VREFDQ may be simultaneously or sequentially generated by a single reference voltage provider.

The scheme for determining the command/address-buffer reference voltage VREFCA or the data-buffer reference voltage VREFDQ will hereinafter be described with reference to FIGS. 2 and 3.

In an embodiment of the present invention, the semiconductor memory device including the reference voltage generator 10 therein may generate the reference voltages (e.g., VREFDQ and VREFCA) without receiving the data-buffer reference voltage VREFDQ and the command/address-buffer reference voltage VREFCA from an external device.

When a power-up process of the semiconductor memory device starts, if the command/address-buffer reference voltage VREFCA and the data-buffer reference voltage VREFDQ are not set to predetermined values, the semiconductor memory device may not recognize the data input (e.g., DQ), which is input to the data buffer, or the command/address input (e.g., CA0, . . . , CAn), which is input to the command/address buffer. Therefore, the command/address-buffer reference voltage VREFCA and the data-buffer reference voltage VREFDQ are set to predetermined values at an initial stage of the power-up process so that the data buffer and the command/address buffer can normally operate in subsequent processes.

After the command/address-buffer reference voltage VREFCA or the data-buffer reference voltage VREFDQ has been set up, the command/address buffer and the data buffer may be normally operated by using the generated reference voltages (e.g., VREFCA, VREFDQ) and a training operation of the command/address-buffer reference voltage VREFCA or the data-buffer reference voltage VREFDQ may be performed.

After the power-up process of the semiconductor memory device is completed, the command/address-buffer reference voltage VREFCA or the data-buffer reference voltage VREFDQ may have various voltage levels in response to the command/address input CA0, . . . , CAn. Since the command/address-buffer reference voltage VREFCA or the data-buffer reference voltage VREFDQ has already been set up, the semiconductor memory device may normally receive the command/address input CA0, . . . , CAn to perform a training operation of the internal reference voltage (VREF).

A register 400 may generate a command/address set signal CAset<0:n> in response to the command/address input CA0, . . . , CAn. The register may be a mode register. In an embodiment of the present invention, the mode register 400 may generate a command/address set signal CAset<0:n> based on the operation mode or operation characteristic according to the command/address input CA0, . . . , CAn, and may provide the command/address set signal CAset<0:n> to the second decoder 200.

The second decoder 200 may generate a reference voltage set signal Refset in response to the default set signal Set in a power-up process. After the command/address-buffer reference voltage VREFCA and the data-buffer reference voltage VREFDQ are set up, the second decoder 200 may generate the reference voltage set signal Refset in response to the command/address input CA0, . . . , CAn.

The reference voltage set signal Refset generated in response to the command/address input CA0, . . . , CAn may have more various distinctive values than those of the other reference voltage set signal generated in response to the default set signal Set. Therefore, the reference voltage provider 300 according to the present invention may adjust the command/address-buffer reference voltage VREFCA or the data-buffer reference voltage VREFDQ.

Figure 2:
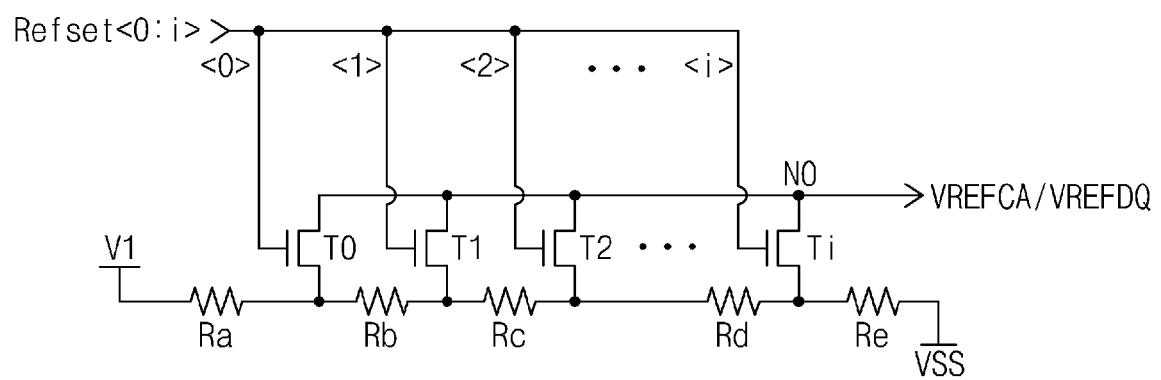
FIG. 2 is a detailed circuit diagram illustrating a reference voltage provider shown in FIG. 1.

FIG. 2 is a detailed circuit diagram illustrating a reference voltage provider of FIG. 1.

Referring to FIG. 2, the reference voltage provider 300 includes a plurality of resistors Ra, . . . , Re connected in series between a ground voltage VSS and a first voltage V1, and a plurality of transistors T0, T1, T2, . . . , Ti connected in parallel between a node among the plurality of resistors and an output node NO for outputting either the command/address-buffer reference voltage VREFCA or the data-buffer reference voltage VREFDQ. The plurality of resistors Ra, . . . , Re may act as a voltage divider. In this case, the first voltage V1 may correspond to a driving voltage.

The first voltage V1 may be a core power-supply voltage VDD2 or I/O power-supply voltage VDDQ supplied from an external device of the semiconductor memory device. The core power-supply voltage VDD2 may be a kind of a power-supply voltage for use in LPDDR, and may range from −0.4V to 1.6V. The I/O power-supply voltage VDDQ is a power-supply voltage for I/O driving, which is input to the data I/O buffer, and may have the range of about 1.2V+/−0.6V.

The reference voltage provider 300 may provide the first voltage V1 as the command/address-buffer reference voltage VREFCA or the data-buffer reference voltage VREFDQ through one or more transistors of the plurality of the transistors T0, T1, T2, . . . , Ti which is/are turned on in response to the reference voltage set signal Refset.

For example, if a second bit of the reference voltage set signal Refset is enabled, the second transistor T1 is turned on in response to a second reference voltage set signal bit Refset<1>. The command/address-buffer reference voltage VREFCA or the data-buffer reference voltage VREFDQ may be represented by Equation 1. In Equation 1, the command/address-buffer reference voltage VREFCA and the data-buffer reference voltage VREFDQ are generically named 'VREF'. In more detail, the command/address-buffer reference voltage VREFCA may be denoted by Equation 2, and the data-buffer reference voltage VREFDQ may be denoted by Equation 3.

$$VREF = V1 \times \frac{Rc + \ldots + Rd + Re}{Ra + Rb + Rc + \ldots + Rd + Re} \quad \text{[Equation 1]}$$

$$VREFCA = VDD2 \times \frac{Rc + \ldots + Rd + Re}{Ra + Rb + Rc + \ldots + Rd + Re} \quad \text{[Equation 2]}$$

$$VREFDQ = VDDQ \times \frac{Rc + \ldots + Rd + Re}{Ra + Rb + Rc + \ldots + Rd + Re} \quad \text{[Equation 3]}$$

However, the above-mentioned values are achieved by the same-sized transistors T0, T1, T2, . . . , Ti. If the transistors are configured to have different sizes, the command/address-buffer reference voltage VREFCA and the data-buffer reference voltage VREFDQ may have different values according to difference in drive capability between transistors.

In some embodiments of the present invention, during a power-up process of the semiconductor memory device, the reference voltage set signals Refset having only two different may be generated in response to the default set signal Set. Therefore, two bits selected from a plurality of bits of the reference voltage set signal Refset may be enabled. For example, if the clock enable signal CKE has a first logic state when the reset signal Reset_n is enabled, a p-th bit (where p is an integer, p≤i) of the reference voltage set signal Refset is enabled. If the clock enable signal CKE has a second logic state when the reset signal Reset_n is enabled, a q-th bit (where q is an integer, q i) of the reference voltage set signal Refset is enabled. As a result, the command/address-buffer reference voltage VREFCA or the data-buffer reference voltage VREFDQ may be generated.

After the command/address-buffer reference voltage VREFCA and the data-buffer reference voltage VREFDQ are set up through a power-up process, the command/address-buffer reference voltage VREFCA and the data-buffer reference voltage VREFDQ may be generated in response to the reference voltage set signal Refset generated according to the command/address set signal CAset<0:n>.

As described above, by using the command/address set signal CAset<0:n>, the reference voltage set signal Refset which have more various values may be generated. For example, the second decoder 200 may generate (i+1)-bit reference voltage set signals Refset<0:i> in response to the command/address set signal CAset<0:n>. Therefore, after the reference voltages (e.g., VREFCA, VREFDQ) have been set up based on the default set signal Set, the reference voltages (e.g., VREFCA, VREFDQ) received from the reference voltage provider 300 may change by a smaller step voltage, and a training operation of the internal reference voltage (e.g., VREFCA, VREFDQ) may be performed. For example, the step voltage may correspond to an amount of a voltage change occurring when each of transistors T0, T1, T2, . . . , Ti of FIG. 2 is turned on or off.

Figure 3:
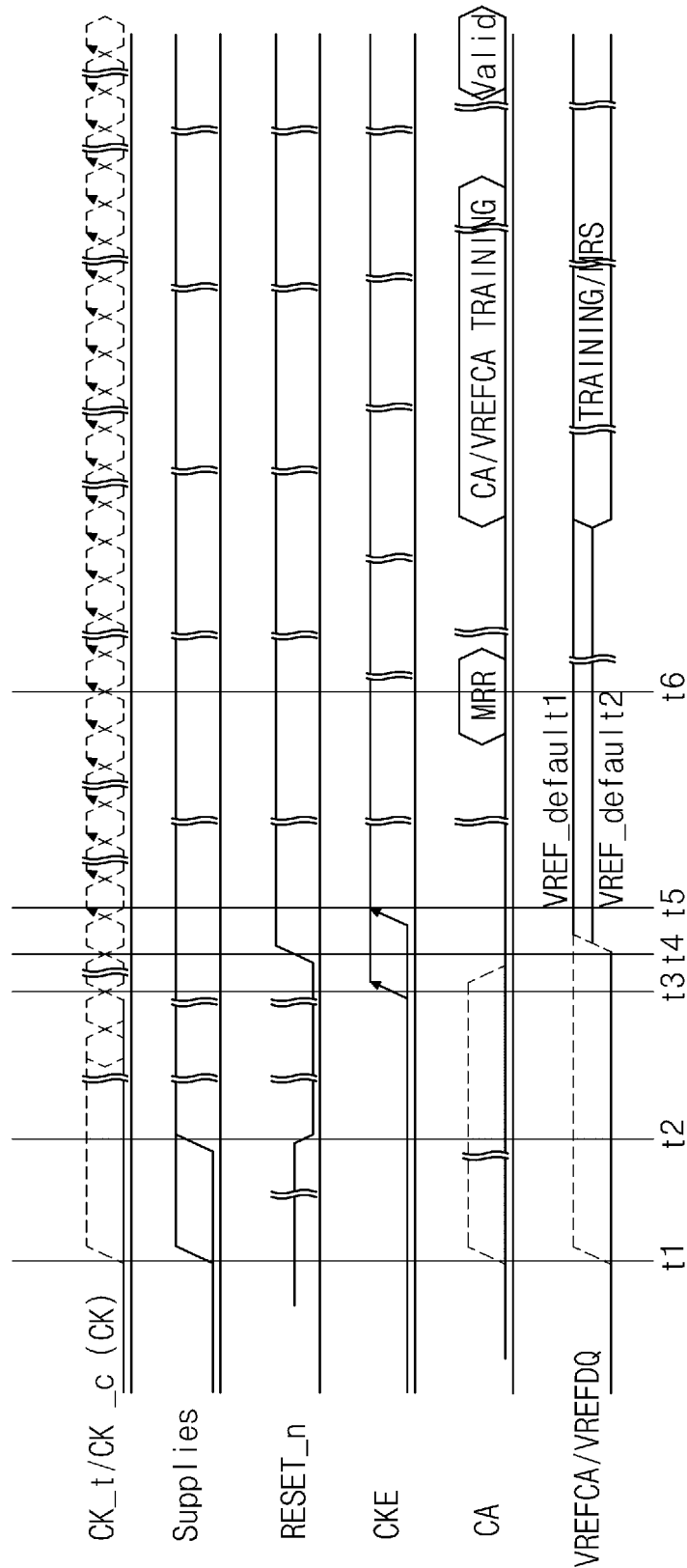
FIG. 3 is a timing diagram illustrating operations of the reference voltage generator according to an embodiment of the present invention.

FIG. 3 is a timing diagram illustrating operations of the reference voltage generator according to an embodiment of the present invention.

Referring to FIG. 3, a clock signal CK, e.g., differential clock signals CK_t, CK_c are input to the reference voltage generator, so that the semiconductor memory device can be operated in response to the rising edge and/or the falling edge of the clock signal CK, e.g., the differential clock signals CK_t, CK_c.

A supply voltage Supplies refers to a voltage received from an external device. For example, the supply voltage Supplies may include a power-supply voltage (e.g., VDD), a core power-supply voltage (e.g., VDD2), an I/O power-supply voltage (e.g., VDDQ), etc. The reset signal Reset_n rises to initialize the operations during the power-up process and may maintain a logic high state during a normal operation.

A first time point t1 corresponds to a power-down state. At the first time point t1, a clock signal CK, the supply voltage Supplies, and the command/address input CA0, . . . , CAn stay in 'Don't care' state. In addition, the command/address-buffer reference voltage VREFCA and the data-buffer reference voltage VREFDQ are not yet set up at the first time point t1.

A logic state of the reset signal Reset_n transitions to a logic low state at a second time point t2, so that an initial reset operation starts. The supply voltage Supplies is provided during a reset operation so that the clock signal CK may be generated internally. However, after lapse of a predetermined time, corresponding to a period of the clock signal CK, from a time point when the clock enable signal CKE has been enabled, the clock signal CK can be stabilized. Therefore, after a third or fifth time point t3 or t5 at which at least one clock enable signal CKE is enabled, the clock signal CK may be stabilized after one period of a predetermined clock signal CK.

If the reset operation starts, each of the reference voltages VREFCA, VREFDQ may have a constant value, and an enable time of the clock enable signal CKE may be determined to normally receive the command/address input CA0, . . . , CAn and the data input (e.g., DQ). As described above, the reference voltage generator 10 according to an embodiment of the present invention may determine each voltage level of the reference voltages VREFCA, VREFDQ according to a logic state of the clock enable signal CKE at a transition time (e.g., rising edge of FIG. 3) of the reset signal Reset_n.

For example, if the clock enable signal CKE is enabled at the third time point t3, the clock enable signal CKE corresponds to a logic high state at a fourth time point t4 at which the reset signal Reset_n transitions to another state. Therefore, the reference voltage VREFCA, VREFDQ may correspond to a first default reference voltage VREF_default1. The command/address-buffer reference voltage VREFCA and the data-buffer reference voltage VREFDQ may be generated based on different first voltages V1. Therefore, the first default reference voltage VREF_default1 may represent a relative magnitude of the first voltage V1, and the command/address-buffer reference voltage VREFCA may be different from the data-buffer reference voltage VREFDQ. In other words, the first default reference voltage VREF_default1 may indicate a distribution degree of the first voltage V1 according to the reference voltage set signal Refset of FIG. 2. The first voltage V1 for generating the command/address-buffer reference voltage VREFCA and the data buffer reference voltage VREFDQ may correspond to the core power-supply voltage (e.g., VDD2) and the I/O power-supply voltage (e.g., VDDQ), respectively, so that it is different from the core power-supply voltage (e.g., VDD2) and the I/O power-supply voltage (e.g., VDDQ) and as such detailed voltage levels may be different from each other.

In an embodiment of the present invention, the clock enable signal CKE is not enabled until reaching the fourth time point t4 at which the reset signal Reset_n transitions to another state, and is then enabled at the fifth time point t5. In this case, the clock enable signal CKE corresponds to a logic low state at the fourth time point t4 at which the reset signal Reset_n transitions to another state, and the first decoder 100 generates the default set signal Set, such that the reference voltage provider 300 may generate a second default reference voltage VREF_default2. The second default reference voltage VREF_default2 may represent a relative magnitude of the first voltage V1 in the same manner as in the first default reference voltage VREF_default1, and may have a different value for each of the command/address-buffer reference voltage VREFCA and the data-buffer reference voltage VREFDQ.

In some embodiments of the present invention, the default set signal Set is generated in response to the clock enable signal CKE state at a transition time of the reset signal Reset_n so that the first default reference voltage VREF_default1 and the second default reference voltage VREF_default2 are generated. The semiconductor memory device according to an embodiment of the present invention may detect three or more logic states the clock enable signal CKE at a transition time of the reset signal Reset_n, and thus determine three or more reference voltages.

A time period from fourth time point t4 to sixth time point t6 may be understood as an initialization period of a semiconductor memory. That is, after the reset signal Reset_n is enabled and is reset to a constant supply voltage Supplies, the semiconductor memory device may be self-initialized.

During the initialization process of the semiconductor memory device, a default reference voltage value is set up, and the command/address CA0, . . . , CAn and the mode register read command are input at the sixth time point t6, such that the semiconductor memory device may operate in a specific operation mode.

In order to allow the semiconductor memory device to operate in a specific operation mode, the command/address may be determined in response to a default reference voltage VREF_default, and the command/address-buffer reference voltage VREFCA and the data-buffer reference voltage VREFDQ are determined and trained again in response to the command/address input CA0, . . . , CAn.

Accordingly, the operations of the semiconductor memory device can be efficiently carried out in the end.

The semiconductor memory device including the reference voltage generator 10 therein according to an embodiment of the present invention may set up the command/address-buffer reference voltage VREFCA in response to the reset signal Reset_n and the clock enable signal CKE so that the command/address input CA0, . . . , CAn and the data input signal DQ can be normally input to the initialization process such as the power-up process. Therefore, the command/address-buffer reference voltage VREFCA and the data-buffer reference voltage VREFDQ need not be input to the semiconductor memory device during the initialization process. Because a reference voltage for operating the semiconductor memory device can be set up without reference voltages provided from external device, power consumption of the semiconductor memory device may be reduced and the number of external pins or pads of the semiconductor memory device may be reduced.

Figure 4:
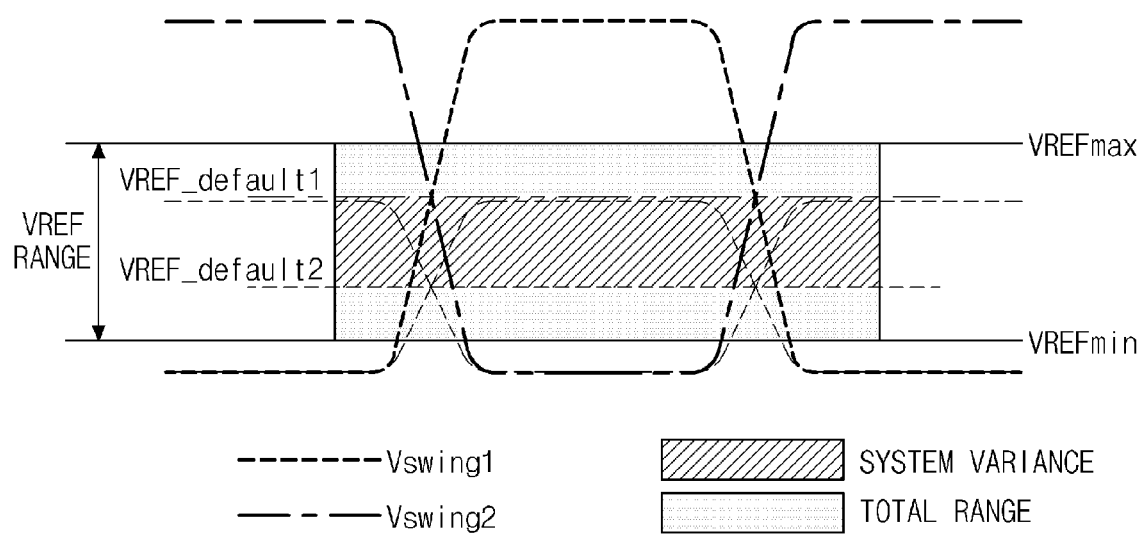
FIG. 4 illustrates the relationship between the range of a reference voltage generated in the semiconductor memory device and an input voltage swing according to an embodiment of the present invention.

FIG. 4 illustrates the relationship between the range of a reference voltage generated in the semiconductor memory device and an input voltage swing according to an embodiment of the present invention.

In FIG. 4, an internal reference voltage VREF may range from a minimum reference voltage VREFmin to a maximum reference voltage VREFmax. As described above, the internal reference voltage VREF may be set to the first default reference voltage VREF_default1 or the second default reference voltage VREF_default2 according to a logic state of the clock enable signal CKE within a transition interval of the reset signal Reset_n during the power-up process. In accordance with an embodiment of the present invention, a reference voltage value may have three or more values. After the power-up process, the reference voltage may be set up in response to the command/address input CA0, . . . , CAn.

If the voltage swing level is small as in a first voltage swing Vswing1, the first default reference voltage VREF_default1 may be set up. If the voltage swing level is large as in a second voltage swing Vswing2, the second default reference voltage VREF_default2 may be set up.

Therefore, the reference voltage generator 10 may set up different internal reference voltages VREF to various voltage swing levels, such that it can identify each input value of the command/address buffer and the data input buffer.

Figure 5:
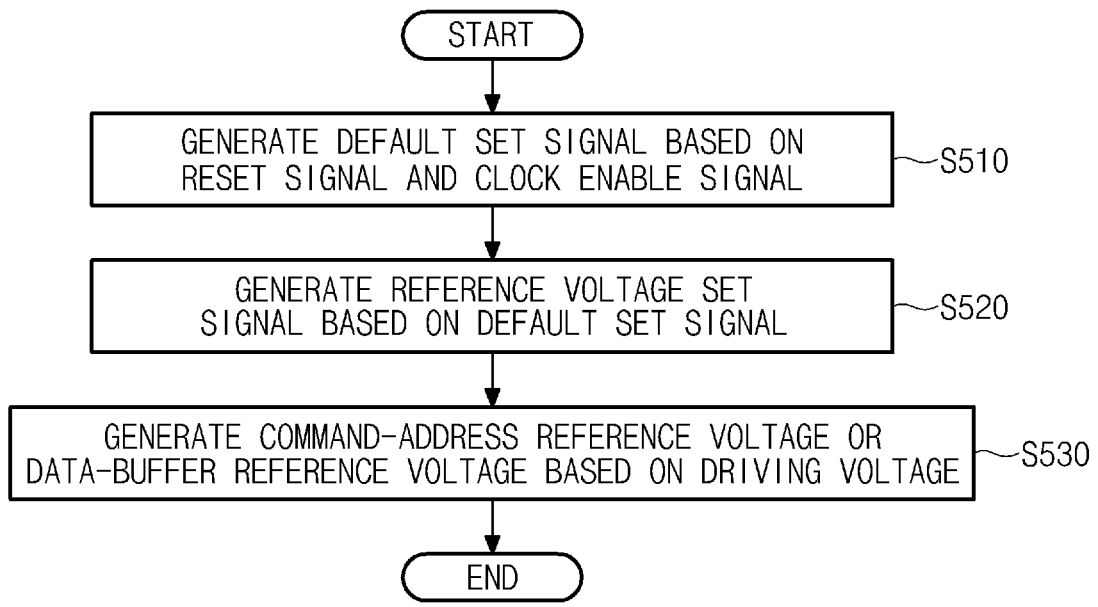
FIG. 5 is a flowchart illustrating a method for generating a reference voltage needed for operating the semiconductor memory device according to an embodiment of the present invention.

FIG. 5 is a flowchart illustrating a method for generating a reference voltage of the semiconductor memory device according to an embodiment of the present invention.

Referring to FIG. 5, a method for generating a reference voltage may include generating a default set signal Set in response to a reset signal Reset_n and a clock enable signal CKE in step S510. In more detail, the first decoder 100 may generate a default set signal Set based on a logic state of the clock enable signal CKE at a transition time (for example, a rising edge) of the reset signal Reset_n.

For example, assuming that the clock enable signal CKE corresponds to a logic high state at an enabling time of the reset signal Reset_n, the default set signal corresponding to a logic high state may be generated. If the clock enable signal CKE corresponds to a logic low state at an enabling time of the reset signal Reset_n, the default set signal Set corresponding to a logic low state may be generated. However, the above-mentioned description is disclosed only for illustrative purposes, and the logic states and associated signal characteristics may vary according to various embodiments of the present invention.

As described above, the semiconductor memory device according to an embodiment of the present invention may identify two logic states of the clock enable signal CKE at the enabling time of the reset signal Reset_n. Also, the semiconductor memory device according to an embodiment of the present invention may identify three or more states based on a voltage level of the clock enable signal CKE, such that it may generate and provide the default set signal Set having a plurality of bits.

The second decoder 200 generates the reference voltage set signal Refset in response to the default set signal Set received from the first decoder 100 in step S520. While the second decoder 200 generates the reference voltage set signal Refset in response to the default set signal Set during the power-up process, after internal reference voltages VREF (e.g., the command/address-buffer reference voltage VREFCA and the data buffer reference voltage VREFDQ) are set up, the second decoder 200 may generate the reference voltage set signal Refset in response to the command/address set signal CAset<0:n> received from the mode register 400 according to the command/address input CA0, . . . , CAn.

The reference voltage provider 300 may generate the command/address-buffer reference voltage VREFCA or the data-buffer reference voltage VREFDQ in response to a driving voltage (e.g., first voltage V1 of FIG. 2) according to the received reference voltage set signal in step S530. In response to the driving voltage applied to the reference voltage provider 300, for example, if the core power-supply voltage (e.g., VDD2) is provided as a driving voltage, the reference voltage provider 300 may generate the command/address-buffer reference voltage VREFCA. If the I/O power-supply voltage (e.g., VDDQ) is provided as a driving voltage, the reference voltage provider 300 may generate the I/O power-supply voltage (e.g., VDDQ).

As described above, the semiconductor memory device according to an embodiment of the present invention may set up an internal reference voltage VREF in response to the reset signal Reset_n and the clock enable signal CKE during an initialization process. Therefore, the internal reference voltage VREF such as the command/address-buffer reference voltage VREFCA and the data-buffer reference voltage VREFDQ need not be received from an external device, an enable time point of the clock enable signal CKE may be set up in consideration of a transition time of the reset signal Reset_n so that the internal reference voltage VREF may be set up.

As described above, the semiconductor memory device according to an embodiment of the present invention does not determine a reference voltage in a fabrication process such as a wiring process. Instead, the semiconductor memory device according to an embodiment of the present invention may adaptively change the reference voltage according to operation characteristics.

As is apparent from the above description, the semiconductor memory device according to embodiments of the present invention may set up a reference voltage for a command/address and data I/O without receiving an external input. Instead, the semiconductor memory device according to an embodiment of the present invention may set up internal reference voltages in response to a reset signal and a clock enable signal. Therefore, chip area may decrease by reducing the number of pins connected to an external device.

The semiconductor memory device and a method for generating a reference voltage according to embodiments of the present invention can prevent reference voltage level reduction or instability caused by noise of a transfer line upon receiving a reference voltage from an external device, such that the semiconductor memory device can be more stably operated.

Figure 6:
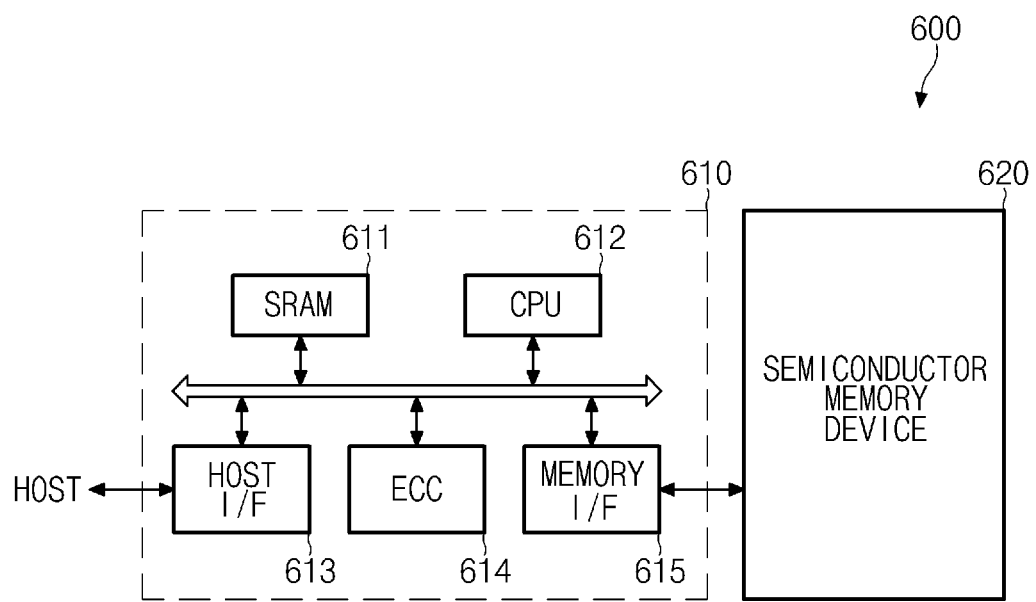
FIG. 6 is a block diagram illustrating a memory system according to an embodiment of the present invention.

FIG. 6 is a block diagram illustrating a memory system according to an embodiment of the present invention.

In FIG. 6, the memory system 600 of the present embodiment may include a semiconductor memory device 620, a memory controller 610, and a CPU 612.

The semiconductor memory device 620 may serve as a volatile memory device such as a DRAM. The memory controller 610 may control the semiconductor memory device 620, and may include a static random-access memory (SRAM) 611, a host interface 613, and Error Correction Code Block (ECC) 614, and a memory interface 615. The SRAM 611 may be used as an operation memory of the CPU 612. The CPU 612 may perform control operation for data exchange of the memory controller 610, and the host interface 613 may have data exchange protocol of a host accessed to the memory system 600. The ECC 614 may detect and correct error of data read from the semiconductor memory device 620, and the memory interface 615 may interface with the semiconductor memory device 620. The memory controller 610 may include further ROM for storing data for interfacing with the host, etc.

Figure 7:
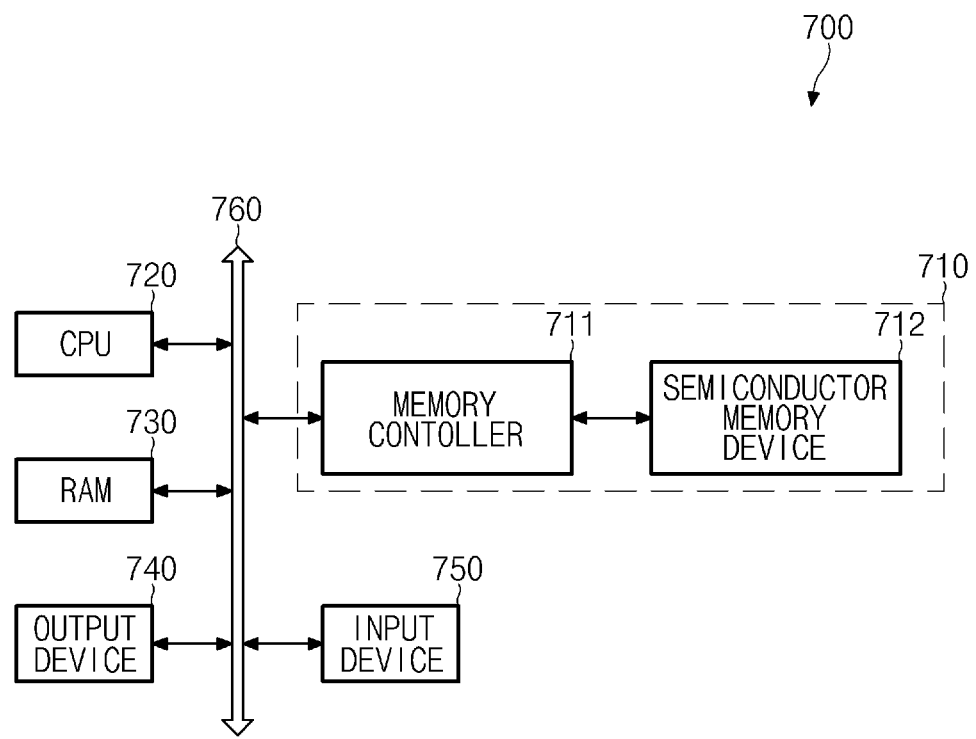
FIG. 7 is a view illustrating an electronic device or a computing system according to an embodiment of the present invention.

FIG. 7 is a view illustrating an electronic device or a computing system according to an embodiment of the present invention.

In FIG. 7, the computing system 700 of the present embodiments may include a CPU 720 connected electrically to a system bus 760, a RAM 730, a user interface 740, an input device 750, and a memory system 710 including a memory controller 711 and a semiconductor memory device 712. In case that the computing system 700 is a mobile device, a battery (not shown) for supplying an operation voltage to the computing system 700 may be further provided. The computing system 700 of the present invention may further include an application chipset, a CMOS image processor CIS, a mobile DRAM, etc.

The output device or user interface 740 may be a self-contained display in the case of a portable electronic device. The input device or modem 750 may be a physical keyboard or a virtual keyboard in the case of a portable electronic device, and may further include, without limitation, a trackball, touchpad, or other cursor control device combined with a selection control, such as a pushbutton, to select an item highlighted by cursor manipulation. The memory system 710 may include a semiconductor memory device as described in FIG. 6.

Those skilled in the art will appreciate that the present invention may be carried out in other specific ways than those set forth herein without departing from the spirit and essential characteristics of the present invention. The above various embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an embodiment of the present invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor memory device comprising:
a first decoder configured to generate a default set signal by detecting a logic state of a clock enable signal during a transition time of a reset signal transitioning from a first logic state to a second logic state opposing the first logic state, the clock enable signal stabilizing a clock signal;
a second decoder configured to generate a reference voltage set signal based on the default set signal; and
a reference voltage provider configured to generate an internal reference voltage based on the reference voltage set signal.

2. The semiconductor memory device according to claim 1, wherein the default set signal is generated in such a manner that a magnitude of the internal reference voltage has a predetermined ratio with respect to a driving voltage of the reference voltage provider.

3. The semiconductor memory device according to claim 2, wherein the first decoder, if the clock enable signal has a first logic state when the reset signal transitions from the first logic state to the second logic state, generates a first default set signal in a manner that a ratio of the internal reference voltage to the driving voltage has a first value; and
the first decoder, if the clock enable signal has a second logic state when the reset signal transitions from the first logic state to the second logic state, generates a second default set signal in a manner that a ratio of the internal reference voltage to the driving voltage has a second value.

4. The semiconductor memory device according to claim 1, wherein the reference voltage provider is driven in response to at least one of a core power-supply voltage and an input/output power-supply voltage.

5. The semiconductor memory device according to claim 4, wherein the reference voltage provider is driven by the core power-supply voltage, and the internal reference voltage is a command/address-buffer reference voltage.

6. The semiconductor memory device according to claim 4, wherein the reference voltage provider is driven by the input/output power-supply voltage, and the internal reference voltage is a data-buffer reference voltage.

7. The semiconductor memory device according to claim 1, wherein the reference voltage provider includes a voltage divider.

8. The semiconductor memory device according to claim 1, further comprising:
a register configured to generate a command/address set signal in response to a command/address input, and provide the command/address set signal to the second decoder.

9. The semiconductor memory device according to claim 8, wherein:
after the internal reference voltage is set up during the power-up process, the internal reference voltage is trained in response to the command/address set signal.

10. A method for generating a reference voltage, comprising:
detecting a logic state of a clock enable signal during a transition time of a reset signal transitioning from a first logic state to a second logic state opposing the first logic state, the clock enable signal stabilizing a clock signal;
generating a default set signal based on the detected logic state of the clock enable signal ;
generating a reference voltage set signal in response to the default set signal; and
generating an internal reference voltage in response to the reference voltage set signal and a driving voltage.

11. The method according to claim 10, wherein the internal reference voltage comprises a command/address-buffer reference voltage and a data-buffer reference voltage.

12. The method according to claim 11, further comprising:
after setting up at least one of the command/address-buffer reference voltage and the data-buffer reference voltage during the power-up process, training at least one of the command/address-buffer reference voltage and the data-buffer reference voltage in response to the driving voltage and a command/address input.

13. The method according to claim 12, wherein generating the reference voltage set signal based on the default set signal includes:
generating the reference voltage set signal in response to the command/address input, after setting up the reference voltage.

14. The method according to claim 11, wherein generating the internal reference voltage in response to the reference voltage set signal and the driving voltage includes:
generating the command/address-buffer reference voltage if the driving voltage corresponds to a core power-supply voltage; and
generating the data-buffer reference voltage if the driving voltage corresponds to an input/output power-supply voltage.

15. The method according to claim 11, wherein detecting the logic state of the clock enable signal includes:
detecting the clock enable signal at a rising edge of the reset signal during the power-up process.

16. A memory system, comprising:
a semiconductor memory device;
a memory controller configured to control the memory device;
a memory interface configured to communicate between the semiconductor memory device and the memory controller; and
a microprocessor configured to control the memory controller;
wherein the semiconductor memory device comprises:
a first decoder configured to generate a default set signal by detecting a logic state of a clock enable signal during a transition time of a reset signal transitioning from a first logic state to a second logic state opposing the first logic state, the clock enable signal stabilizing a clock signal;
a second decoder configured to generate a reference voltage set signal based on the default set signal; and
a reference voltage provider configured to generate an internal reference voltage based on the reference voltage set signal.

17. The memory system according to claim 16, wherein the default set signal is generated in such a manner that a magnitude of the internal reference voltage has a predetermined ratio with respect to a driving voltage of the reference voltage provider .

18. The memory system of claim 16, wherein the reference voltage provider generates a command/address-buffer reference voltage or a data-buffer reference voltage in response to a driving voltage.

* * * * *